(12) United States Patent
Nebat et al.

(10) Patent No.: US 8,250,441 B2
(45) Date of Patent: Aug. 21, 2012

(54) OUTER CODING FRAMEWORK FOR APPLICATION PACKET ERROR RATE MINIMIZATION

(75) Inventors: Yoav Nebat, San Diego, CA (US); Sina Zehedi, San Diego, CA (US)

(73) Assignee: Wi-LAN Inc., Ottawa, Ontario (CA)

( * ) Notice: Subject to any disclaimer, the term of this patent is extended or adjusted under 35 U.S.C. 154(b) by 1002 days.

(21) Appl. No.: 12/167,186

(22) Filed: Jul. 2, 2008

(65) Prior Publication Data

US 2009/0150752 A1    Jun. 11, 2009

Related U.S. Application Data

(60) Provisional application No. 61/007,360, filed on Dec. 11, 2007, provisional application No. 61/019,572, filed on Jan. 7, 2008, provisional application No. 61/024,507, filed on Jan. 29, 2008, provisional application No. 61/060,117, filed on Jun. 9, 2008.

(51) Int. Cl.
    *H03M 13/00* (2006.01)
(52) U.S. Cl. ....................................... 714/776
(58) Field of Classification Search ................... 714/776
    See application file for complete search history.

(56) References Cited

U.S. PATENT DOCUMENTS

| | | | |
|---|---|---|---|
| 5,546,409 A | 8/1996 | Karasawa | |
| 5,826,018 A | 10/1998 | Vixie et al. | |
| 5,983,383 A | 11/1999 | Wolf | |
| 6,021,433 A | 2/2000 | Payne et al. | |
| 6,085,253 A | 7/2000 | Blackwell et al. | |
| 7,031,249 B2 | 4/2006 | Kowalski | |
| 7,058,027 B1 * | 6/2006 | Alessi et al. | ............... 370/310.1 |
| 7,343,540 B2 | 3/2008 | Khermosh et al. | |
| 7,464,319 B2 | 12/2008 | Budge et al. | |
| 7,644,343 B2 | 1/2010 | Gubbi et al. | |

(Continued)

FOREIGN PATENT DOCUMENTS

EP    1 718 096    11/2006

(Continued)

OTHER PUBLICATIONS

FORM PCT/ISA/220, Notification of the Trasmittal of the International Search Report and the Written Opinion of the International Searching Authority, or the Declaration, mailed May 18, 2009.

(Continued)

*Primary Examiner* — M. Mujtaba K Chaudry
*Assistant Examiner* — Enam Ahmed
(74) *Attorney, Agent, or Firm* — Volpe and Koenig, P.C.

(57) ABSTRACT

The subject matter disclosed herein provides an outer coding framework for minimizing the error rate of packets, such as application data packets used to transmit digital video broadcast data as well as other forms of data. In one aspect, there is provided a method. The method may include inserting a received packet into one or more rows of a frame. The one or more rows including the received packets may be encoded using an outer code. A block of data from a column of the frame may be read. The frame may include the one or more rows encoded using the outer code. The block that is read may be provided to enable an inner code to encode the block before transmission through a wireless network. Related systems, apparatus, methods, and/or articles are also described.

24 Claims, 13 Drawing Sheets

U.S. PATENT DOCUMENTS

| | | | |
|---|---|---|---|
| 7,660,245 | B1 | 2/2010 | Luby |
| 7,877,663 | B2 | 1/2011 | Vesma et al. |
| 2002/0147954 | A1 | 10/2002 | Shea |
| 2003/0081564 | A1 | 5/2003 | Chan |
| 2003/0207696 | A1 | 11/2003 | Willenegger et al. |
| 2003/0226092 | A1 | 12/2003 | Kim et al. |
| 2004/0090932 | A1 | 5/2004 | Wei et al. |
| 2004/0100937 | A1 | 5/2004 | Chen |
| 2004/0199847 | A1 | 10/2004 | Calabro et al. |
| 2004/0199850 | A1 | 10/2004 | Yi et al. |
| 2004/0243913 | A1 | 12/2004 | Budge et al. |
| 2005/0005189 | A1 | 1/2005 | Khermosh et al. |
| 2005/0088986 | A1* | 4/2005 | Sun et al. ............ 370/316 |
| 2005/0135308 | A1 | 6/2005 | Vijayan et al. |
| 2006/0013168 | A1 | 1/2006 | Agrawal et al. |
| 2006/0077890 | A1 | 4/2006 | Suryavanshi et al. |
| 2006/0248430 | A1 | 11/2006 | Iancu et al. |
| 2007/0004437 | A1* | 1/2007 | Harada et al. ............ 455/506 |
| 2007/0101228 | A1 | 5/2007 | Vesma et al. |
| 2007/0165578 | A1 | 7/2007 | Yee et al. |
| 2007/0230351 | A1 | 10/2007 | Dang |
| 2007/0240027 | A1 | 10/2007 | Vesma et al. |
| 2007/0253367 | A1 | 11/2007 | Dang et al. |
| 2007/0268933 | A1 | 11/2007 | Wu et al. |
| 2008/0022345 | A1 | 1/2008 | Kim et al. |
| 2008/0098283 | A1 | 4/2008 | Vayanos et al. |
| 2008/0114711 | A1* | 5/2008 | Nagaraj ............ 706/37 |
| 2008/0225819 | A1 | 9/2008 | Niu et al. |
| 2009/0259920 | A1 | 10/2009 | Guo et al. |
| 2010/0115379 | A1 | 5/2010 | Gubbi et al. |
| 2010/0183077 | A1* | 7/2010 | Lee et al. ............ 375/240.24 |
| 2011/0235724 | A1 | 9/2011 | Kim et al. |

FOREIGN PATENT DOCUMENTS

| | | |
|---|---|---|
| KR | 10-1995-0010768 | 9/1995 |
| KR | 10-0371157 | 3/2003 |
| KR | 10-2005-0114162 | 12/2005 |
| KR | 10-2006-011864 | 10/2006 |
| KR | 10-2006-0064677 | 6/2007 |
| KR | 10-2007-0068456 | 6/2007 |
| WO | 2005/022814 | 3/2005 |

OTHER PUBLICATIONS

IEEE 802.16 Broadband Wireless Access Working Group, IEEE 802.16lmaint-08/293, "Optional outer-coded data mode for MBS," (Sep. 11, 2008).

Jenkac et al., "Flexible outer Reed-Solomon coding on RLC layer for MBMS over GERAN," Vehicular Technology Conference. vol. 5, pp. 2777-2781 (May 2004).

Pursely et al., "Variable-Rate Coding for Meteor-Burst Communications," IEEE Trans. on Comm., vol. 37, No. 11 (Nov. 1989).

Agashe et al., "CDMA2000 High Rate Broadcast Packet Data Air Interface Design," IEEE Comm. Magazine, pp. 83-89 (Feb. 2004).

FORM PCT/ISA/220, Notification of Transmittal of the International Search Report and the Written Opinion of the International Searching Authority, or the Declaration, mailed May 18, 2009.

FORM PCT/ISA/220, Notification of Transmittal of the International Search Report and the Written Opinion of the International Searching Authority, or the Declaration, mailed Apr. 30, 2009.

FORM PCT/ISA/220, Notification of Transmittal of the International Search Report and the Written Opinion of the International Searching Authority, or the Declaration, mailed Apr. 20, 2009.

FORM PCT/ISA/220, Notification of Transmittal of the International Search Report and the Written Opinion of the International Searching Authority, or the Declaration, mailed May 26, 2009.

FORM PCT/ISA/220, Notification of Transmittal of the International Search Report and the Written Opinion of the International Searching Authority, or the Declaration, mailed Jun. 24, 2009 for corresponding PCT Application PCT/US2008/086103.

FORM PCT/ISA/220, Notification of Transmittal of the International Search Report and the Written Opinion of the International Searching Authority, or the Declaration, mailed May 26, 2009 for corresponding PCT Application PCT/US2008/086278.

IEEE 802.16 Broadband Wireless Access Working Group, IEEE 802.16lpc-00/33, "FEC Performance of Concatenated Reed Solomon and Convulational Coding with Interleaving," (Jun. 8, 2000).

IEEE 802.16 Broadband Wireless Access Working Group, IEEE 802.16lmaint-08/293, "Optional outer-coded data mode for MBS." (Sep. 11, 2008).

Jenkac et al., "Flexible outer Reed-Solomon coding on RLC layer for MBMS over GERAN," Vehicular Technology Conference, vol. 5, pp. 2777-2781 (May 2004).

Patent Cooperation Treaty (PCT) International Search Report, PCT/US2008/085984, Notification of Transmittal of the International Search Report and the Written Opinion of the International Searching Authority, or the Declaration, mail date Mar. 27, 2009, 11 pages.

Pursley et al., "Variable-Rate Coding for Meteor-Burst Communications," IEEE Trans. on Comm., vol. 37, No. 11 (Nov. 1989).

QUALCOMM, "MBMS design consideration," 3GPP TSG WGIT, R1-02-1099 (Jan. 7-10, 2003).

Wang et al., "System Architecture and Cross-Layer Optimization of Video Broadcast over WiMAX," IEEE Journal on Selected Areas in Communications, vol. 25, No. 4 pp. 712-721 (May 2007).

Wei et al., "Application of NB/WB AMR Speech Codes in the 30-kHz TDMA System," IEEE Trans. on Comm., vol. 6, No. 6 (Nov. 2004).

IEEE 802.16 Broadband Wireless Access Working Group, IEEE 802.16lpc-00/33, "FEC Performance of Concatenated Reed Solomon and Convolutional Coding with Interleaving." (Jun. 8, 2000).

Jenkac et al., "Flexible outer Reed-Solomon coding on RLC layer for MBMS over GERAN," Vehicular Technology Conference. vol. 5. pp. 2777-2781 (May 2004).

* cited by examiner

OUTER CODING FRAMEWORK FOR APPLICATION PACKET ERROR RATE MINIMIZATION

CROSS REFERENCE TO RELATED APPLICATION

This application claims the benefit under 35 U.S.C. §119 (e) of the following provisional applications, all of which are incorporated herein by reference in their entirety: U.S. Ser. No. 61/007,360, entitled "Multimedia Broadcast System," filed Dec. 11, 2007; U.S. Ser. No. 61/019,572, entitled "Multimedia Broadcast System," filed Jan. 7, 2008; U.S. Ser. No. 61/024,507, entitled "Multimedia Broadcast System," filed Jan. 29, 2008; and U.S. Ser. No. 61/060,117, entitled "Multimedia Broadcast System," filed Jun. 9, 2008.

FIELD

The subject matter described herein relates to wireless communications and, more particularly, error-correction coding.

BACKGROUND

Channel coding, such as forward error-correction coding or error-correction coding, introduces redundancy into a signal prior to transmission or storage of the signal. The redundancy enables a receiving system to detect and, perhaps, correct errors introduced into the signal by, for example, the channel, receiver, transmitter, storage medium, and the like. For example, in a communication system that employs forward error-correction coding, a source provides data to an encoder (also referred to as a coder). The encoder inserts redundant (also sometimes referred to as parity) bits, thereby outputting a longer sequence of code bits, called a codeword. The codewords can then be transmitted to a receiver, which uses a suitable decoder to extract the original, unencoded data and correct errors caused by, for example, the channel and/or the receiver.

Channel coding can thus be used to detect and/or correct errors—reducing the need for the source transmitter to retransmit data received in error. By reducing the need to retransmit data that is in error, the throughput of the channel or link is improved. Moreover, the correction of errors also improves the quality of the data received at the receiver. In the case of a digital video broadcast, error-correction coding enhances not only the quality of the digital video broadcast over the wireless channel but also improves the throughput of the wireless channel.

SUMMARY

The subject matter disclosed herein provides methods and apparatus for an outer coding framework for minimizing the error rate of data, such as packets used to transmit a digital video broadcast as well as other forms of data.

In one aspect, there is provided a method. The method may include inserting a received packet into one or more rows of a frame. The one or more rows including the received packets may be encoded using an outer code. A block of data from a column of the frame may be read. The frame may include the one or more rows encoded using the outer code. The block that is read may be provided to enable an inner code to encode the block before transmission.

In another aspect, there is provided a method. The method may include decoding, using an inner code, one or more link-layer packets. One of the decoded link-layer packets may be inserted into one or more columns of a frame. The outer code may be used to decode one or more rows of the frame, when the columns of the frame have been filled. The one or more rows of the frame may be read, when the one or more rows are decoded using the outer code, the one or more rows of the frame forming an application data packet.

In another aspect there is provided a system. The system may include means for inserting a received packet into one or more rows of a frame. The system also includes means for encoding, using an outer code, the one or more rows including the received packet and means for reading a block of data from a column of the frame. The frame may include the one or more rows encoded using the outer code. Moreover, the system includes means for providing the block to enable an inner code to encode the block before transmission through a wireless network.

In another aspect there is provided a system. The system may include a framer configured to insert a received packet into one or more rows of a frame and an outer coder configured to encode, using an outer code, the one or more rows including the received packet. The framer is also configured to read a block of data from a column of the frame. The frame may include the one or more rows encoded using the outer code, and may provide the block to enable an inner code to encode the block before transmission through a wireless network.

In another aspect, there is provided a system. The system may include a deframer configured to insert one or more link-layers packet into one or more columns of a frame and an outer decoder configured to decode, using an outer code, one or more rows of the frame, when the columns of the frame have been filled. The framer is configured to read the one or more rows of the frame, when the one or more rows are decoded using the outer code. The one or more rows of the frame form an application data packet.

In another aspect there is provided a computer-readable medium containing instructions to configure at least one processor to perform a method. The method may include inserting a received packet into one or more rows of a frame. The method also includes encoding, using an outer code, the one or more rows including the received packet. The method also includes reading a block of data from a column of the frame. The frame may include the one or more rows encoded using the outer code. The method also includes providing the block to enable an inner code to encode the block before transmission.

In another aspect there is a computer-readable medium containing instructions to configure at least one processor to perform a method. The method may include decoding, using an inner code, one or more link-layer packets. The method also includes inserting one of the decoded link-layer packets into one or more columns of a frame and decoding; using an outer code, one or more rows of the frame, when the columns of the frame have been filled; and reading the one or more rows of the frame, when the one or more rows are decoded using the outer code. The one or more rows of the frame form an application data packet.

Variations of the above aspects may include one or more of the following features. A portion of the received packet may be inserted into a first row of the frame and, when the first row is filled, inserting a remaining portion of the received packet into a second row of the frame. The first row may be encoded using the outer code to form a first codeword and the second row may be encoded using the outer code to form a second codeword. The outer code may be implemented as a forward error-correction code to encode each of the rows, such that each encoded row forms a codeword. The outer code may be implemented as a Reed-Solomon (RS) forward error-correction code to encode each of the rows, such that each encoded codeword forms an RS codeword. When a block is read from the frame, a portion of the column may be read, when at least one of the rows of the frame has been encoded using the outer code. When a block is read from the frame, one or more blocks may be read, when at least one of the rows of the frame has been encoded using the outer code. The block may be packed into a link-layer packet, which may be further encoded using the inner code before being sent. The inner code may be implemented as at least one of a Convolution Code (CC) and a Convolutional Turbo Code (CTC). The link-layer packet is encoded with the inner code before being sent through a channel to a client station configured to receive the encoded link-layer packet. Each of the one or more rows may be arranged as a horizontal portion of the frame, and the column may be arranged as a vertical portion of the frame. Each of the one or more rows may be arranged as a vertical portion of the frame, and the column may be arranged as a horizontal portion of the frame.

The details of one or more variations of the subject matter described herein are set forth in the accompanying drawings and the description below. Features and advantages of the subject matter described herein will be apparent from the description and drawings, and from the claims.

Figure 1:
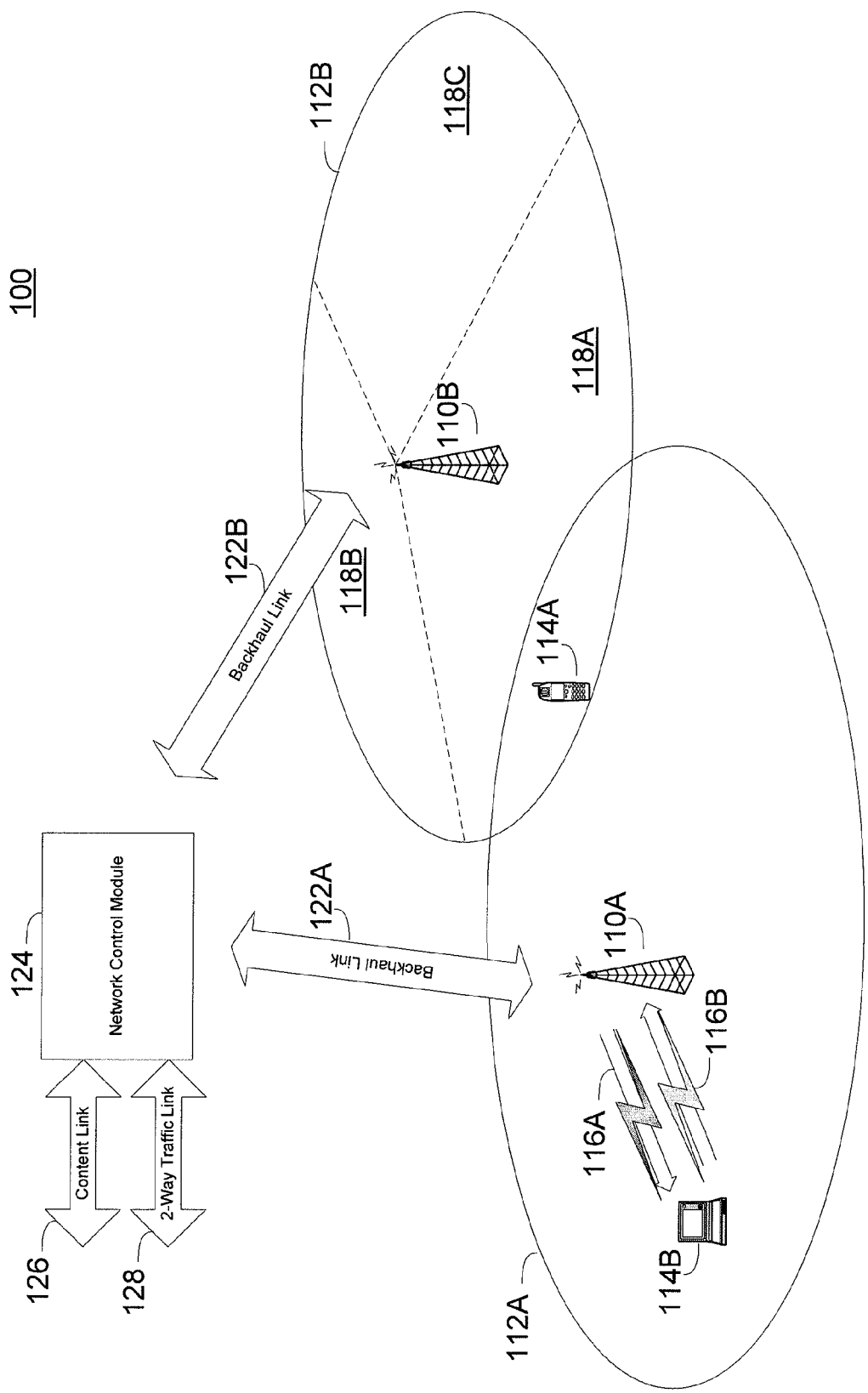
FIG. 1 depicts a block diagram of a network including client stations and base stations.

Like labels are used to refer to same or similar items in the drawings.

DETAILED DESCRIPTION

FIG. 1 is a simplified functional block diagram of an embodiment of a wireless communication system 100. The wireless communication system 100 includes a plurality of base stations 110A and 110B, each supporting a corresponding service or coverage area 112A and 112B. The base stations are capable of communicating with wireless devices within their coverage areas. For example, the first base station 110A is capable of wirelessly communicating with a first client station 114A and a second client station 114B within the coverage area 112A. The first client station 114A is also within the coverage area 112B and is capable of communicating with the second base station 110B. In this description, the communication path from the base station to the client station is referred to as a downlink 116A and the communication path from the client station to the base station is referred to as an uplink 116B.

Although for simplicity only two base stations are shown in FIG. 1, a typical wireless communication system 100 includes a much larger number of base stations. The base stations 110A and 110B can be configured as cellular base station transceiver subsystems, gateways, access points, radio frequency (RF) repeaters, frame repeaters, nodes, or any wireless network entry point.

The base stations 110A and 110B can be configured to support an omni-directional coverage area or a sectored coverage area. For example, the second base station 110B is depicted as supporting the sectored coverage area 112B. The coverage area 112B is depicted as having three sectors, 118A, 118B, and 118C. In typical embodiments, the second base station 110B treats each sector 118 as effectively a distinct coverage area.

Although only two client stations 114A and 114B are shown in the wireless communication system 100, typical systems are configured to support a large number of client stations. The client stations 114A and 114B can be mobile, nomadic, or stationary units. The client stations 114A and 114B are often referred to as, for example, mobile stations, mobile units, subscriber stations, wireless terminals, or the like. A client station can be, for example, a wireless handheld device, a vehicle mounted device, a portable device, client premise equipment, a fixed location device, a wireless plug-in accessory or the like. In some cases, a client station can take the form of a handheld computer, notebook computer, wireless telephone, personal digital assistant, wireless email device, personal media player, meter reading equipment or the like and may include a display mechanism, microphone, speaker and memory.

In a typical system, the base stations 110A and 110B also communicate with each other and a network control module 124 over backhaul links 122A and 122B. The backhaul links 122A and 122B may include wired and wireless communication links. The network control module 124 provides network administration and coordination as well as other overhead, coupling, and supervisory functions for the wireless communication system 100.

In some embodiments, the wireless communication system 100 can be configured to support both bidirectional communication and unidirectional communication. In a bidirectional network, the client station is capable of both receiving information from and providing information to the wireless communications network. Applications operating over the bidirectional communications channel include traditional voice and data applications. In a unidirectional network, the client station is capable of receiving information from the wireless communications network but may have limited or no ability to provide information to the network. Applications operating over the unidirectional communications channel include broadcast and multicast applications. In one embodiment, the wireless system 100 supports both bidirectional and unidirectional communications. In such an embodiment, the network control module 124 is also coupled to external entities via, for example, content link 126 (e.g., a source of digital video and/or multimedia) and two-way traffic link 128.

The wireless communication system 100 can be configured to use Orthogonal Frequency Division Multiple Access (OFDMA) communication techniques. For example, the wireless communication system 100 can be configured to substantially comply with a standard system specification, such as IEEE 802.16 and its progeny or some other wireless standard such as, for example, WiBro, WiFi, Long Term Evolution (LTE), or it may be a proprietary system. The subject matter described herein is not limited to application to OFDMA systems or to the noted standards and specifications. The description in the context of an OFDMA system is offered for the purposes of providing a particular example only.

As used herein, IEEE 802.16 refers to one or more Institute of Electrical and Electronic Engineers (IEEE) Standard for Local and metropolitan area networks, Part 16: Air Interface for Fixed Broadband Wireless Access Systems, 1 Oct. 2004, IEEE Standard for Local and metropolitan area networks, Part 16: Air Interface for Fixed and Mobile Broadband Wireless Access Systems, 26 Feb. 2006, and any subsequent additions or revisions to the IEEE 802.16 series of standards.

In some embodiments, downlink 116A and uplink 116B each represent a radio frequency (RF) signal. The RF signal may include data, such as voice, video, images, Internet Protocol (IP) packets, control information, and any other type of information. When IEEE-802.16 is used, the RF signal may use OFDMA. OFDMA is a multi-user version of orthogonal frequency division multiplexing (OFDM). In OFDMA, multiple access is achieved by assigning to individual users groups of subcarriers (also referred to as subchannels or tones). The subcarriers are modulated using BPSK (binary phase shift keying), QPSK (quadrature phase shift keying), QAM (quadrature amplitude modulation), and carry symbols (also referred to as OFDMA symbols) including data coded using a forward error-correction code.

Figure 2:
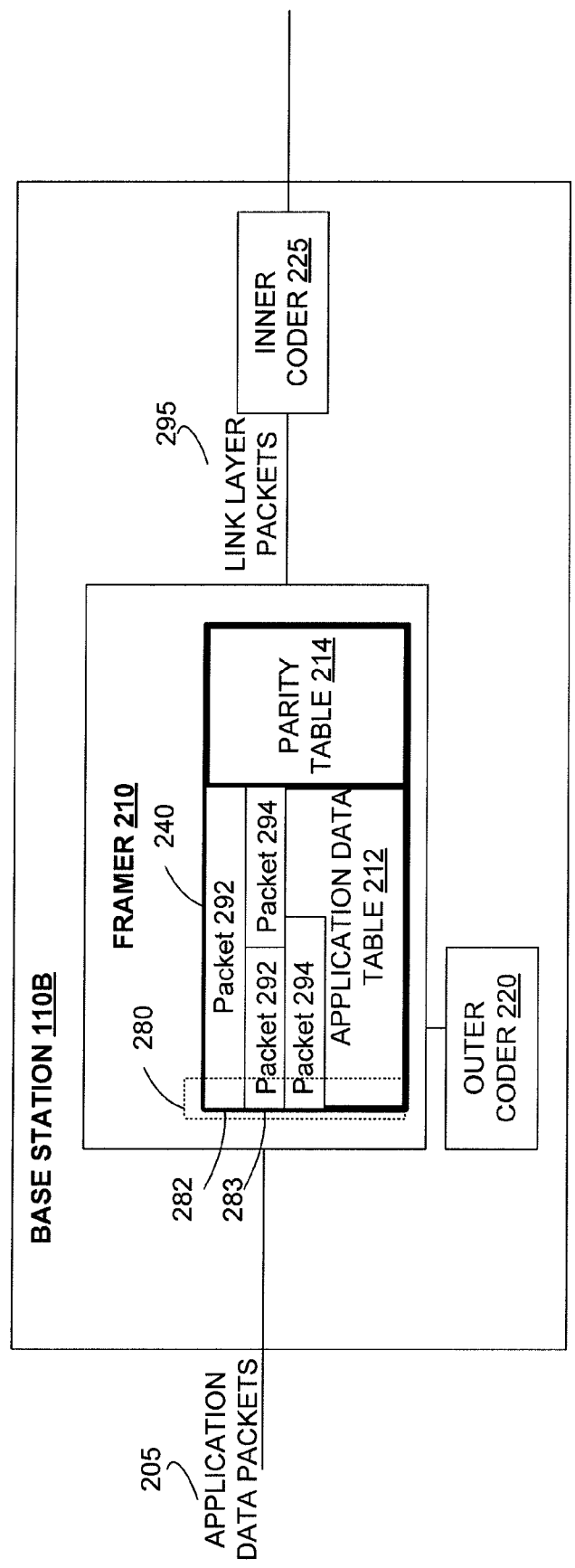
FIG. 2 depicts a block diagram of a base station using outer coding on application data packets.

FIG. 2 depicts an implementation of base station 110B. Base station 110B includes a framer 210 for arranging data into a frame 240, an outer coder 220 for providing an outer coding on the data in the frame 240, and an inner coder 225 for further encoding data that has been encoded by the outer coder 220. The frame 240 further includes an application data table 212 and a parity table 214. The "data" values in frame 240 may be data, such as application data packets (e.g., data packets 292 and 294), or may be references to memory locations where the data can be accessed in memory. In some embodiments, the components of base station 110B may be distributed in one or more locations. For example, the framer 210 and outer coder 220 are implemented at a control module, such as network control module 124, a base station controller, or the like, while inner coder 225 is implemented at each of base stations 110A and 110B. In this example, frame 240 may be sent to each of base stations 110A and 110B, and each of the base stations may encode blocks read from the columns of frame 240 before those encoded blocks are sent to a client station or other device, such as a storage device. Moreover, in some implementations, inner coder 225 is disabled or not included, such that the outer coder 220 is the primary or sole error-correction mechanism. It should be noted that FIG. 2 also illustrates frame 240 including column 280 and rows 282 and 283, described further below with respect to FIG. 3.

Figure 3:
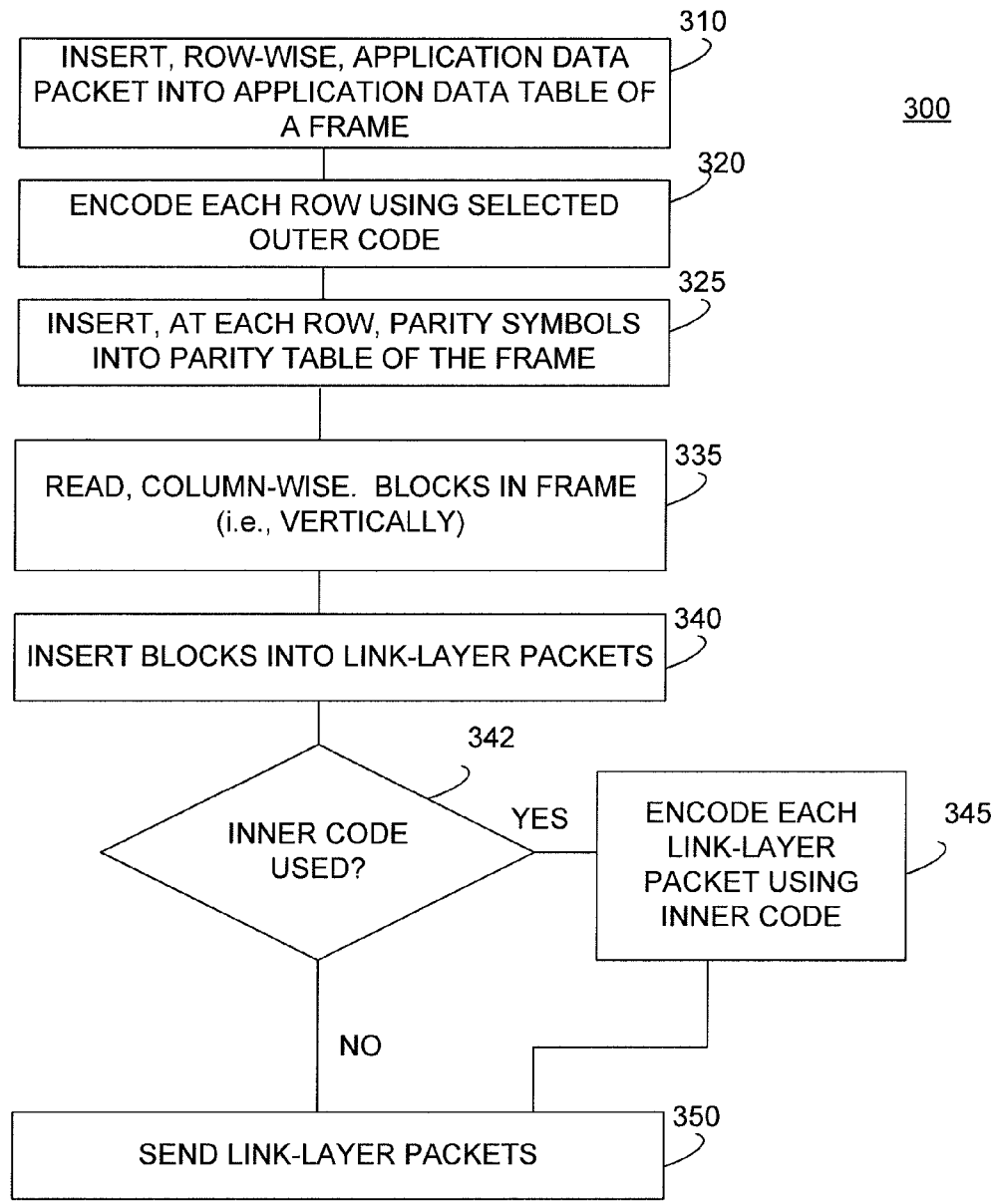
FIG. 3 depicts a process for using outer coding on application data packets received at a base station.

FIG. 3 depicts a process 300 for using an outer code to encode data received at a base station, such as base station 110B. The description of FIG. 3 below will also refer to base station 110B depicted at FIGS. 1 and 2.

At 310, base station 110B may insert row-wise (i.e., along the rows of a frame, table, or data structure) one or more application data packets 205 into an application data table 212 of frame 240 (e.g., a table, data structure, and the like). The application data packets 205 may be received from content link 126, two-way traffic link 128, a base station, or any other component of network 100. The application data packets 205 may include broadcast data, such as a digital video broadcast, although any other data may be included in application data packets.

Furthermore, frame 240 may be stored in a storage medium such as, for example volatile or non-volatile storage mediums. Exemplary volatile storage mediums include random access memory (RAM), such as dynamic RAM (DRAM), static RAM (RAM), and the like. Exemplary non-volatile storage mediums may include magnetic RAM (MRAM), battery backed RAM, and the like. Moreover, the memory provided by the storage medium is typically addressed by rows and columns, such that a memory location can be identified by its row and column. For example, framer 210 may write to and read from frame 240 using the row and column addresses of frame 240 and those read-write operations may result in an access to a corresponding location in memory (e.g., the location in memory being addressed as a row and column in memory using a virtual address or a physical address in memory). Moreover, although in FIGS. 4A, 4B, 5, 6, 10, 11, and 12 the rows are depicted as horizontal portions of the frame and the columns are depicted as vertical portions of the frame, in some embodiments, the rows are arranged as a vertical portion of the frame and, as such, the columns would be arranged as a horizontal portion of the frame.

To insert the received application data packets 205 into application data table 212, framer 210 may insert each received packet row-wise by inserting the received packets sequentially into the rows of the frame 240 (e.g., filling the first row, then the second row, and so forth). In the example of FIG. 2, framer 210 inserts a first packet 292 into the first row and, when that first row is filled, a portion of the second row. Framer 210 also inserts a second packet 294 into the second row and a portion of the third row. Additional application data packets may also be inserted into the remaining rows of application data table 212 until the rows of application data table 212 have been filled and/or until there are no application data packets 205 to send to a client station, such as client station 114A. In some implementations, the insertion of application data packets 205 may also include fill data, which is also referred to as pad packets. Moreover, in the context of the frame 240, the term "fill" refers to putting as many packets as can be held or conveniently contained, but not necessarily filling, the frame to capacity (e.g., a frame can be considered filled when only ½ of the frame is occupied with packets).

At 320, outer coder 220 encodes each row of application data table 212 using an outer code. In some implementations, outer coder 220 encodes each row of frame 240 as that row is filled, while in other cases, outer coder 240 encodes each row of frame 240 when application data table 240 is filled. In some implementations, outer coder 220 is implemented as a forward error-correction coder, such as a Reed-Solomon forward error-correction coder or a low-density parity check (LDPC) coder, although other error-correction or forward error-correction coders may be used as well.

At 325, as each row is encoded using an outer code, outer coder 220 inserts into parity table 214 any parity symbols generated by the outer code. For example, when a Reed-Solomon (RS) (255,243) coder is used, as described further below, each row of frame 240 would include parity symbols having a length of 12, which would be inserted into parity table 214 by outer coder 220.

In some implementations, a Reed-Solomon forward error-correction coder is the outer coder 220. When that is the case, the frame 240 is referred to as an RS table and each row of frame 240 is an RS codeword. For example, the outer coder 220 may use an RS (255,243) code as the outer code. The RS (255,243) code corresponds to a code that takes as an input 243 bytes and outputs a resulting codeword of 255 bytes. Because a Reed-Solomon code is a systematic code, the first 243 positions of the row (which fall in the application data table 212) will be left unchanged and the next 12 columns of the row (which fall in parity table 214) will include the computed parity bytes. The RS (255,243) would thus result in application data table 212 having 243 bytes per row and parity table 214 having 12 parity bytes. For example, when outer coder 220 uses an RS (255,243) code, the outer coder 220 would encode 243 bytes in the first row of application data table 212 and generate the 12 bytes of parity, such that the RS codeword for the first row is 255 bytes, i.e., 243+12. In this example, outer coder 220 would continue to use the RS (255, 243) to encode any remaining rows in frame 240. Although Reed-Solomon is described herein as the outer code, other codes (as well as codes of other sizes) may be used as well including codes that are not systematic, i.e., resulting in a codeword that does not necessarily include a portion that is identical to the original input. Moreover, in some implementations, the Reed-Solomon code may be an RS (255, Y) code, where Y is an odd number between 191 and 253. Although the above example relates to a specific number of rows and columns, frame 240 may be implemented to have any number of rows and columns.

At 335, framer 210 reads blocks of data (or simply "blocks"), wherein the reading is done column-wise, i.e., reading one or more values from the columns of frame 240. For example, framer 240 may read, column-wise, a first block from the first column by reading a first value at row one 282 of the first column 280, then reading another value at the second row 283 of the first column 280, and so forth sequentially down first column 280. In some cases, framer 240 may read an entire column, such as column 280, to form a block, while in other cases, the framer 240 may read a portion of one or more columns to form the block. The frame 240 thus provides an interleaving of the packets inserted at 310.

At 340, framer 340 inserts the blocks read at 335 into packets, such as link-layer packets, although other types of packets and structures of data may be used as well. For example, framer 240 may read a portion of first column 280 to form a link-layer packet having 1600 bytes, although other packet sizes may be used as well. The phrase "link-layer packets" refers to a type of packet that may be exchanged between a base station and a client station. For example, in some embodiments, the link layer packet may be a protocol data unit (PDU) that includes a header in the front and a cyclic redundancy check (CRC) appended to the end of the data, such as a hybrid automatic retransmission request (HARQ) PDU in conformance with the IEEE 802.16 standard, or the link layer packet may be a PDU that does not include a header and an appended CRC, but is instead simply the read data block.

In some implementations, an inner code is also used to further encode the block or link-layer packet read from frame 240 (yes at 342), while in other cases the inner code is not used (no at 342). When the inner code is used at 345, inner coder 225 uses an inner code to encode each of the link-layer packets. The inner coder 225 may encode the link-layer packets using one or more error-correction or forward error-correction coding schemes, such as a Convolution Code (CC), a Convolutional Turbo Code (CTC), and the like.

At 350, the base station 110B sends the link-layer packets to a client station, such as client station 114A. When the inner code is not applied to the link-layer packets, base station 110B sends those packets through the wireless network to client station 114A, relying on the outer code to provide forward error-correction. When the inner code is applied, base station 110B sends through the wireless network to client station 114A the link-layer packets encoded with an outer code concatenated with an inner code. Base station 110B may include other components, such as a radio frequency (RF) front-end comprising an antenna to transmit an RF signal, such as a downlink to client station 114A. The RF front-end may also include other components, such as filters, converters (e.g., digital-to-analog converters and the like), an Inverse Fast Fourier Transform (IFFT) module, and symbol mappers. These and other components may be used to modulate data, such as the link-layer packets, onto the RF signal transmitted by base station 110B. In some implementations, the base station 110B is compatible with IEEE 802.16 and transmits an RF signal configured as an OFDMA signal, including subcarriers carrying the link-layer packets.

Although process 300 is described in connection with a base station sending packets to a client station, process 300 may be used in other applications. For example, process 300 may be used to provide an outer code on data sent to a storage device, such as a hard drive or optical storage device.

Figure 4A:
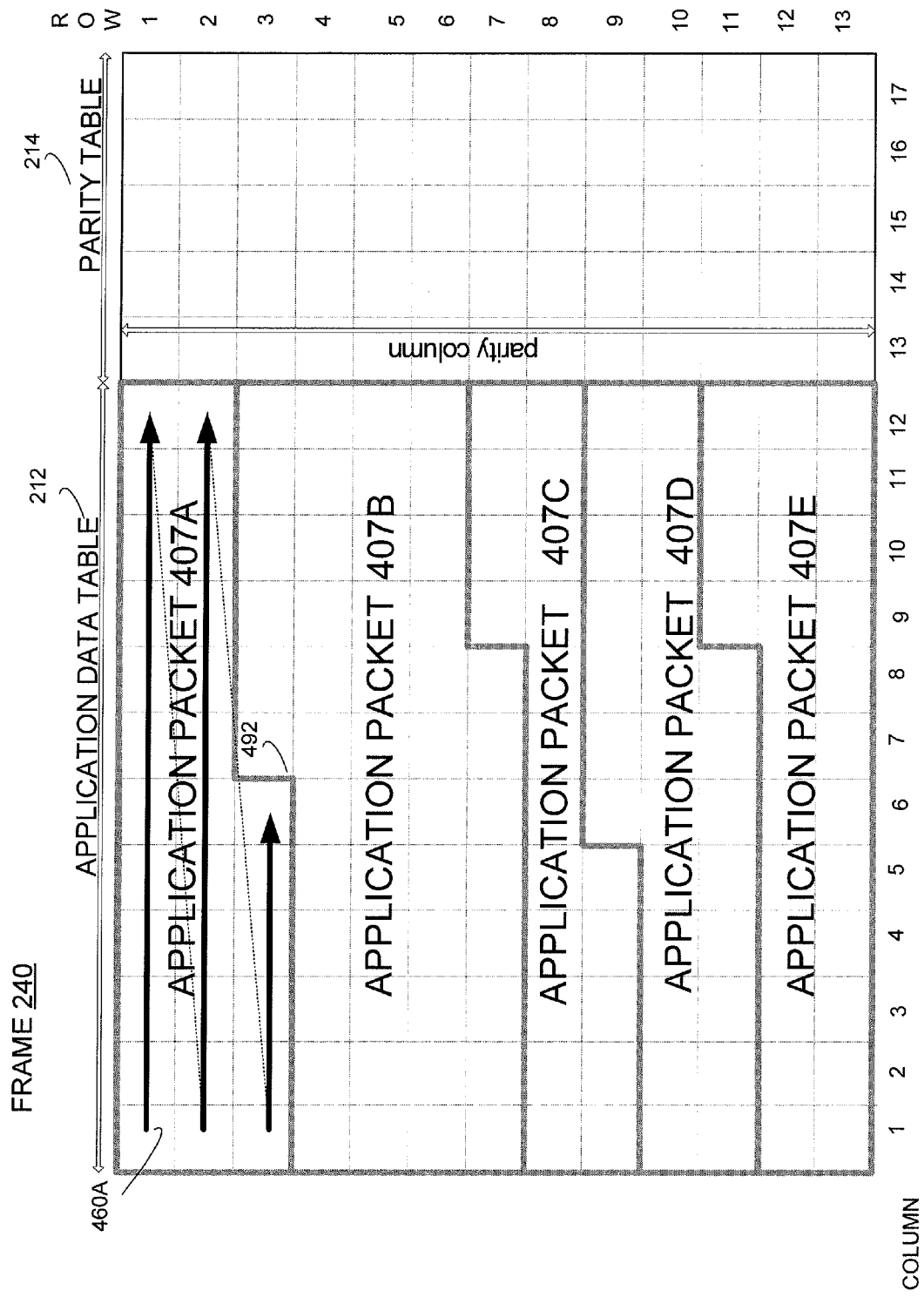
FIGS. 4A, 4B, 5, and 6 depict examples of frames at various stages during the process of outer coding at the base station.

FIGS. 4A, 4B, 5, and 6 depict frame 240 at various stages of process 300. Referring to FIG. 4A, application data packets 407A-E are inserted row-wise into application data table 212. In the example of FIG. 4A, the first application data packet 407A fills three rows. The framer 210 inserts application data packet 407A row-wise across the rows as depicted at pattern 460A, which shows the pattern for how each bit of the packet is written into the rows, although other row-wise writing patterns may be used as well. Framer 210 inserts a second, subsequent application data packet 407B into the remaining portion of the third row and filling the remainder of the third row as well as rows four through six and a portion of row seven. Framer 210 continues to insert application data packets 407C-E row-wise across application data table 212.

Figure 4B:
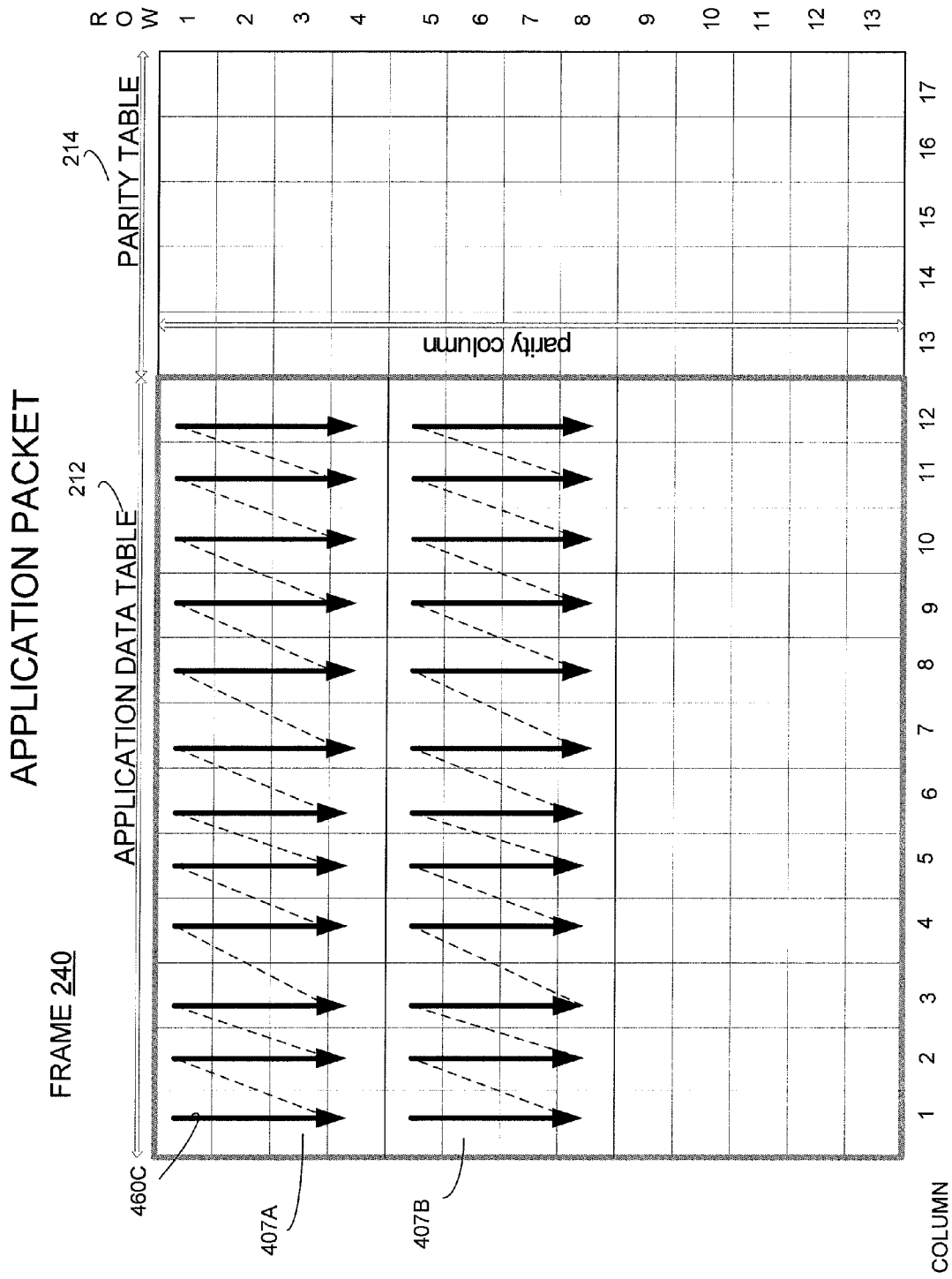

Although FIG. 4A depicts a row-by-row insertion of packets 407A-E, other patterns of packet insertion may be used as well. For example, FIG. 4B depicts a pattern 460C. Referring to FIG. 4B, the framer 210 inserts the first four bytes of first packet 407A into the first column, the next four bytes of first packet 407A into the second column, and so forth. This so-called "block" pattern 460C can be used with other, subsequent application data packets to fill frame 240. For example, application data packet 407B may be inserted into frame 240 using the pattern 460C, as depicted at FIG. 4B. Although pattern 460C depicts a block of 12 columns and 4 rows, other block sizes may be used as well. Additional application data packets, such as application data packets 407B-E, are also inserted into the blocks of frame 240 (and, in particular, application data table 212).

Figure 5:
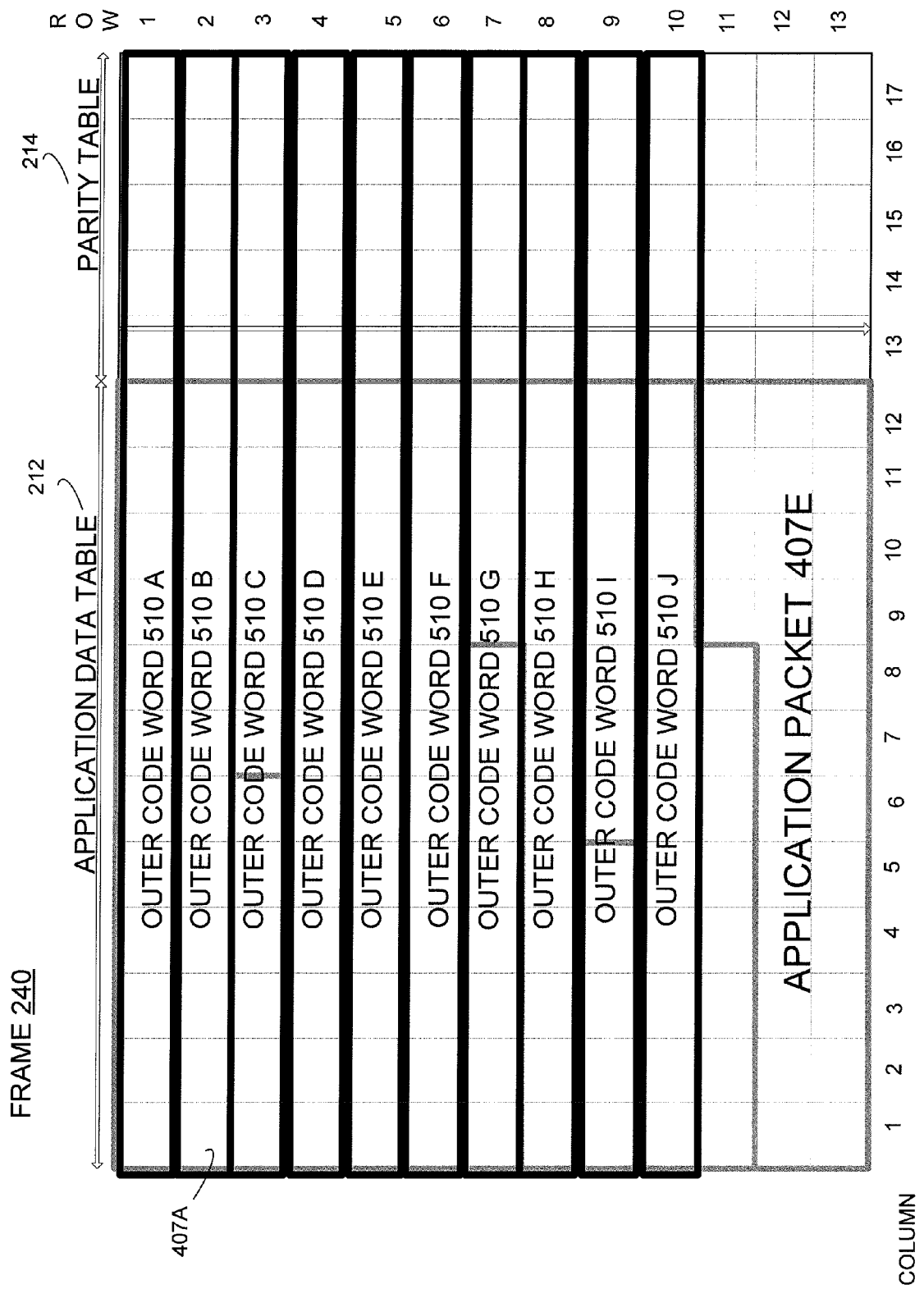

FIG. 5 depicts the frame 240 after the outer coder 220 uses the outer code to encode the first ten rows of frame 240, as described above with respect to FIG. 3 at 320. The first ten rows are depicted as outer codewords 510A-J. The first row is encoded using an outer code, such as an RS code, to form an outer coder word 510A, which includes parity symbols corresponding to the columns of parity table 214. The second row is also encoded using an outer code, such as an RS code, to form an outer coder word 510B, which includes parity symbols corresponding to the columns of parity table 214.

Figure 6:
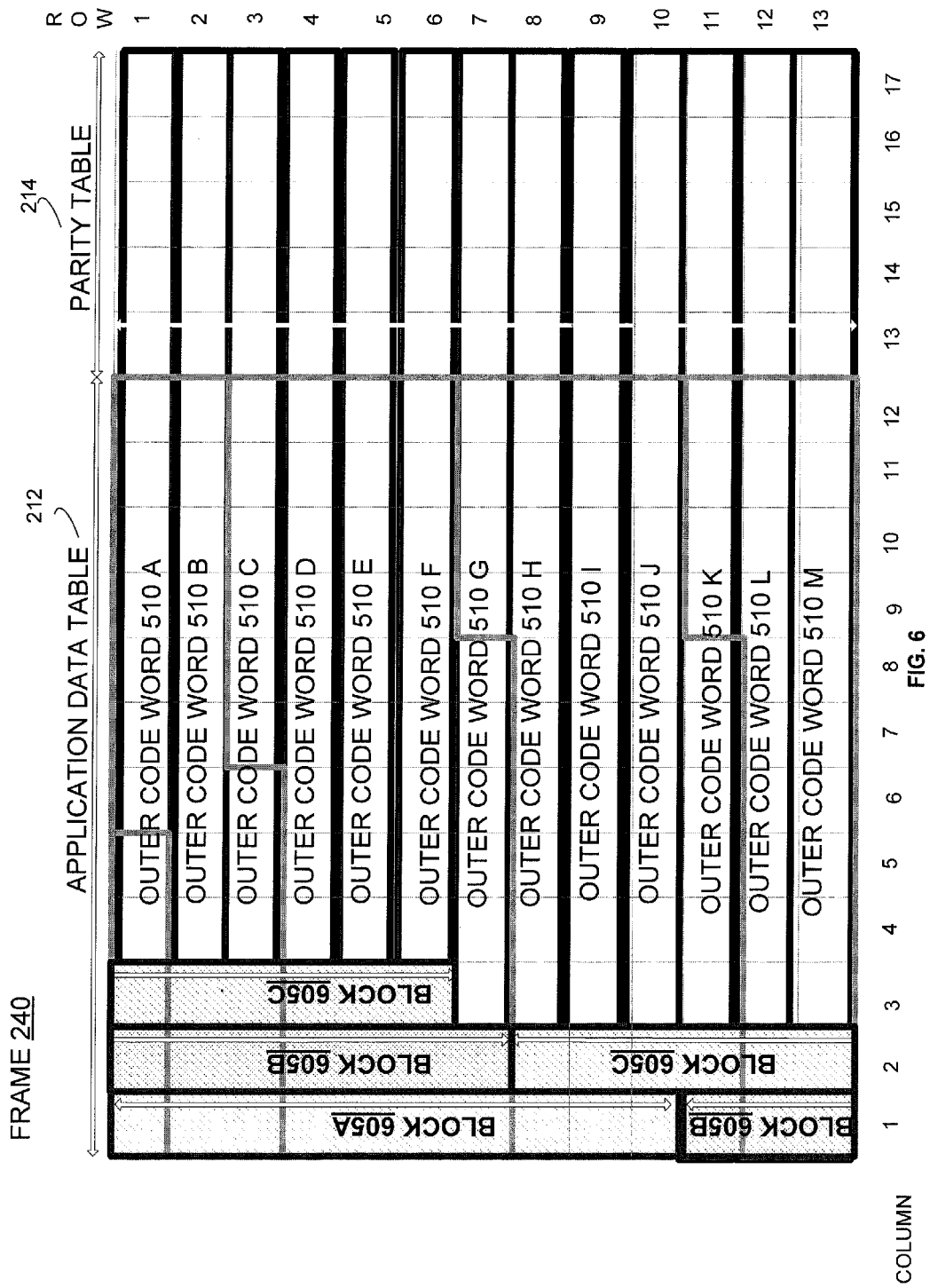

FIG. 6 depicts frame 240 after outer coder 220 has encoded the rows of frame 240 to form outer codewords 510A-M, which includes the parity symbols inserted into parity table 214. FIG. 6 also depicts how blocks may be read column-wise from frame 240. For example, framer 210 reads block 605A from a portion of the first column. Next, framer 210 reads block 605B from the remaining portion of the first column and a portion of the second column, and then reads block 605C from the remaining portion of the second column and a portion of the third column and so forth until all the columns of frame 240 are read. The blocks that are read may then be packaged into link-layer packets and provided to, for example, inner coder 225, so that the block can be encoded using an inner code.

Figure 7:
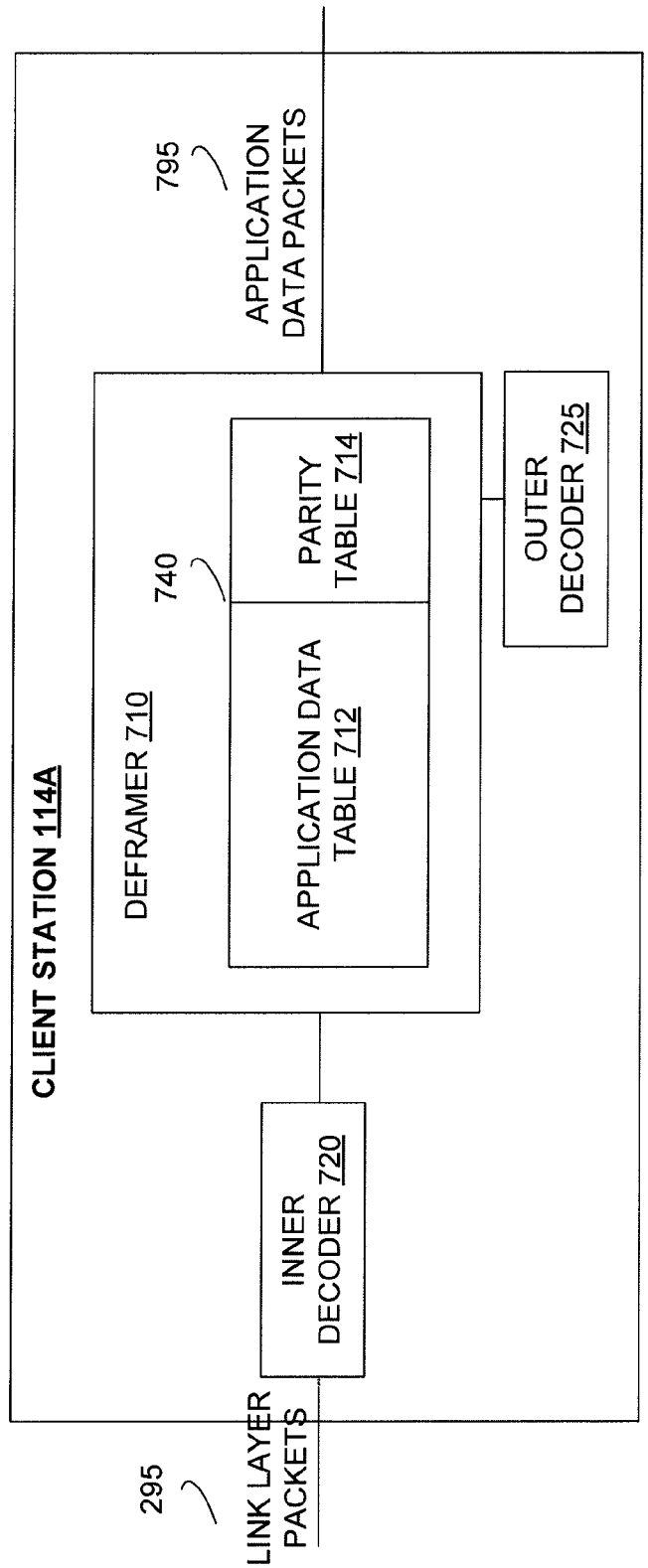
FIG. 7 depicts a block diagram of a client station using outer coding on application data packets.

FIG. 7 depicts a client station 114A. Client station 114A includes an inner decoder 720 for decoding received packets using an inner code, a deframer 710 for arranging data into a frame 740, and an outer decoder 725 for decoding using an outer code. The frame 740 includes an application data table 712 and a parity table 714.

Figure 8:
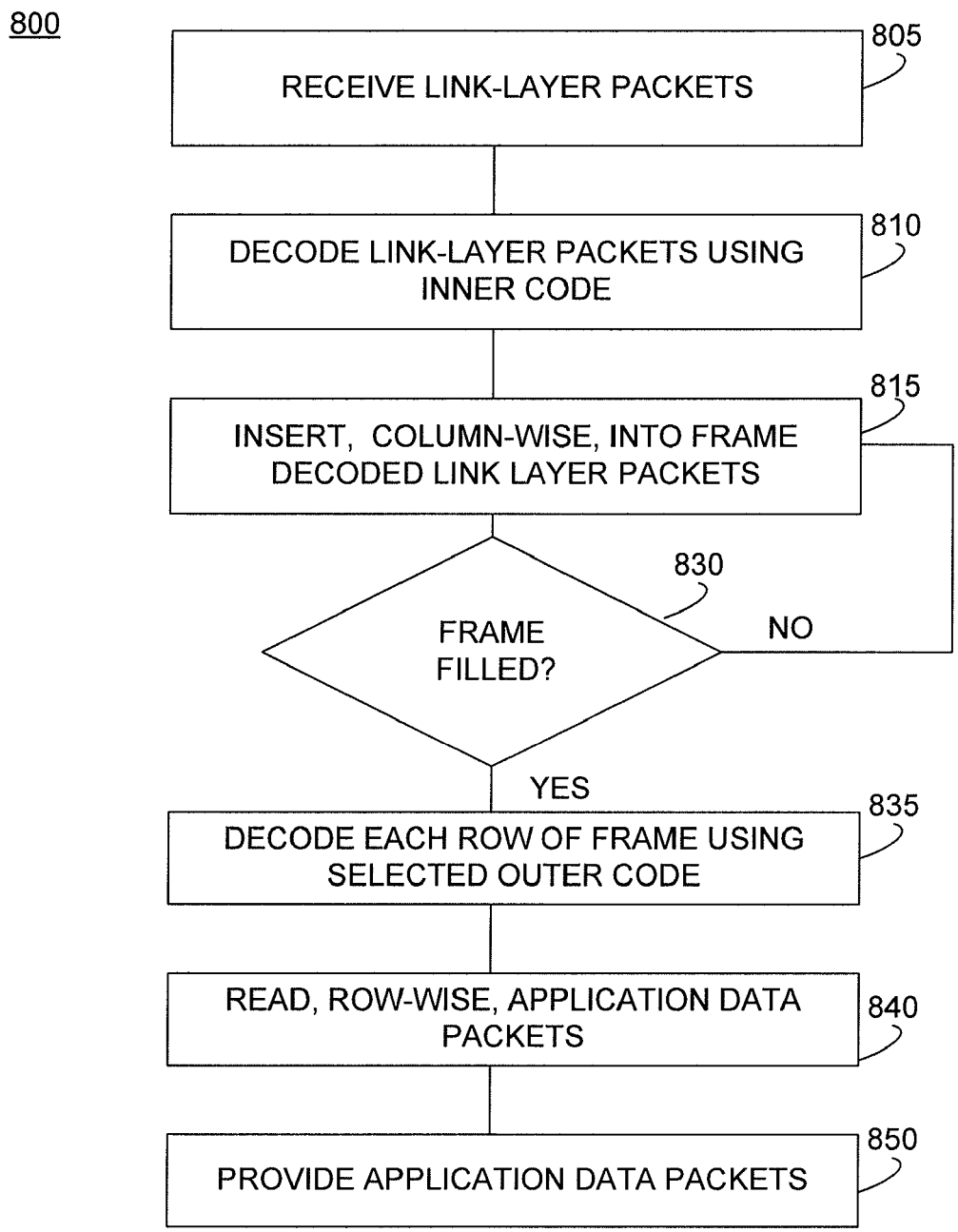
FIG. 8 depicts a process for using outer coding on application data packets received at a client station.

FIG. 8 depicts a process 800 for decoding packets, such as link-layer packets 295 received from a wireless network and base station 110B.

At 805, client station 114A receives one or more link-layer packets 295 from a wireless network and base station 110B. Client station 114A may include a radio frequency (RF) front-end comprising an antenna to receive an RF signal, such as a downlink from base station 110B. The RF front-end may also include other components, such as filters, analog-to-digital converters, a Fast Fourier Transform (FFT) module, and a symbol demapper. These and other components may be used to demodulate the RF signal into data and, in particular, the link-layer packets transmitted by base station 110B and carried by the RF signal. In some implementations, the client station 114A is compatible with IEEE 802.16 and receives an RF signal configured as an OFDMA signal, including subcarriers carrying the link-layer packets.

At 810, the inner decoder 720 decodes, using an inner code, the one or more link-layer packets 295. The inner-code may be implemented as any error-correction or forward error-correction code, such as a Convolutional Turbo Code (CTC), a Convolutional Code (CC), or any other code. For example, inner decoder 720 may be implemented as CTC decoder, the output of which may be provided to deframer 710 for insertion into frame 740 as described below at 815. Moreover, as noted above, in some implementations, the inner code is either disabled or not used, such that decoding by the inner decoder 720 is not necessary.

At 815, client station 114A and, in particular, deframer 710 inserts into frame 740 one or more link-layer packets 295 (or blocks of decode packets), decoded by inner decoder 720. When the data block that is read in 335 (FIG. 3) is augmented with a header (e.g., a generic MAC (media access control) header consistent with IEEE 802.16) before transmission, that header may be removed from the link-layer packets before those packets are inserted column-wise into frame 740. In some implementations, the inner code is not used; nonetheless, link-layer packets 295 are inserted into the frame 240 column-wise.

Figure 9:
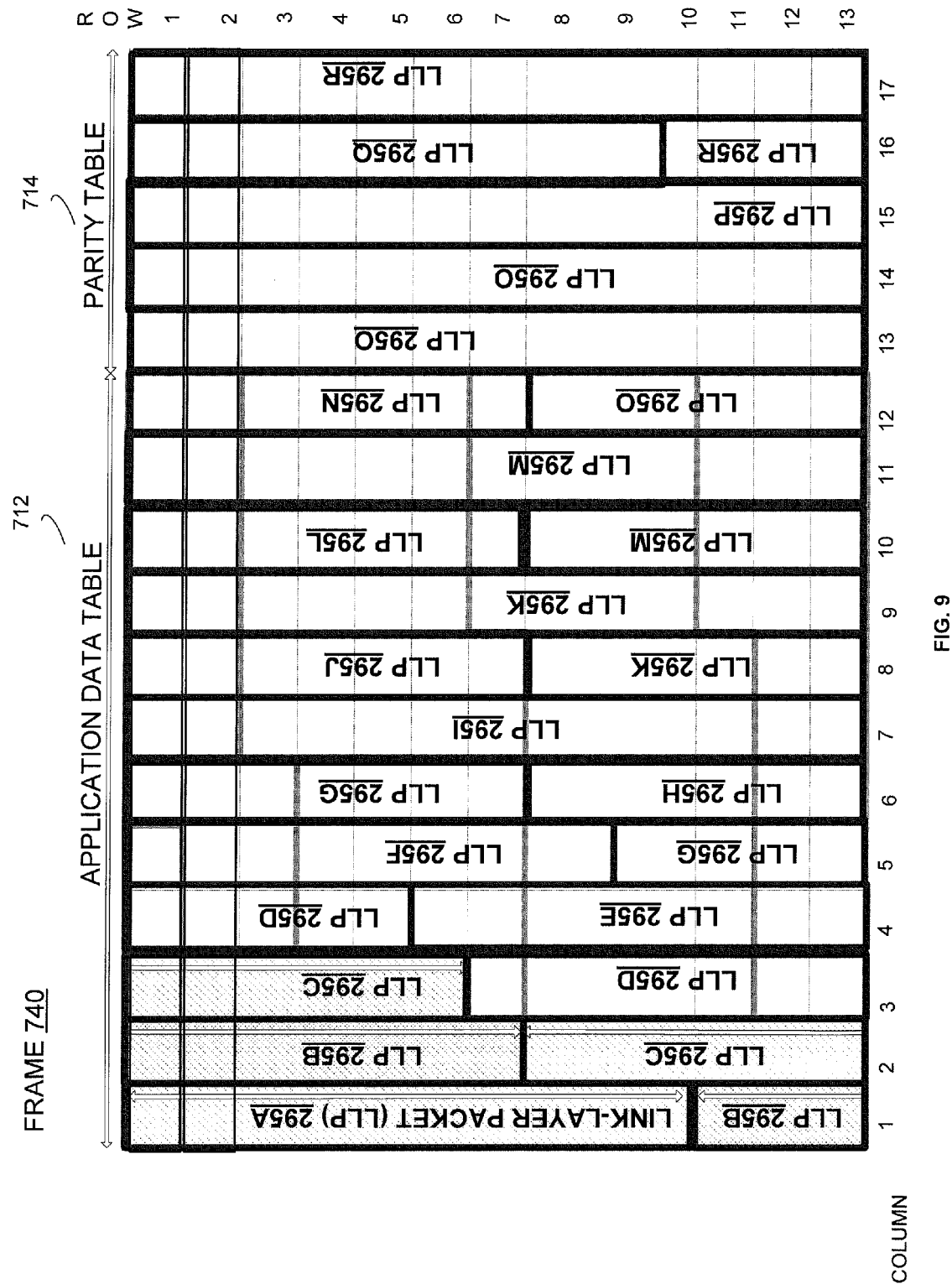
FIGS. 9-11 depict examples of frames at various stages during the process of outer coding at the client station.

FIG. 9 depicts an example of frame 740. As link-layer packets 295 are received by deframer 710, the link-layer packets 295 are inserted column-wise. For example, deframer 710 inserts the first link-layer packet (LLP) 295A into the first column, then inserts the second link-layer packet (LLP) 295B after the first link-layer packet, and so forth until the frame has been filled with link-layer packets 295A-R or there are no more link-layer packets ready to be decoded using the outer code.

At 835, when the frame is filled (yes at 830), the outer decoder 725 decodes each of the rows of the frame using the outer code previously selected at base station 110B. For example, when outer decoder 220 at base station 110B uses an RS (255,243) forward error-correction code, outer decoder 725 at client station 114A uses the same RS (255,243) forward error-correction code selected at base station 110B to decode each row of frame 740. In some implementations using an inner code, outer decoder 725 decodes the rows even when the inner coder 720 indicates an error. This is possible because the outer coding scheme described herein distributes application data packets across a greater number of blocks and codewords, so that an error burst is distributed across several packets—making those errors more likely to be detected and/or corrected by the outer decoder 725. Moreover, the enhanced error-correction may be used to reduce the amount of parity symbols used in frame 240 rather than use the coding gain to correct errors—thus saving bandwidth and providing additional throughput. Moreover, if erasure correction is not used at client station 114A during the outer decoding process 800, additional savings in terms of throughput may be attained.

At 840, when the outer decoder 725 has decoded some of the rows of frame 740, deframer 710 reads, row-wise, each row of frame 740 by reading row-by-row the application data table 712. For example, deframer 710 reads the first row of application data table 712 and continues reading row-by-row to form application data packet(s). When a block pattern is used (as depicted at FIG. 4B), the deframer 710 instead reads one or more blocks of the application data table 712.

Figure 10:
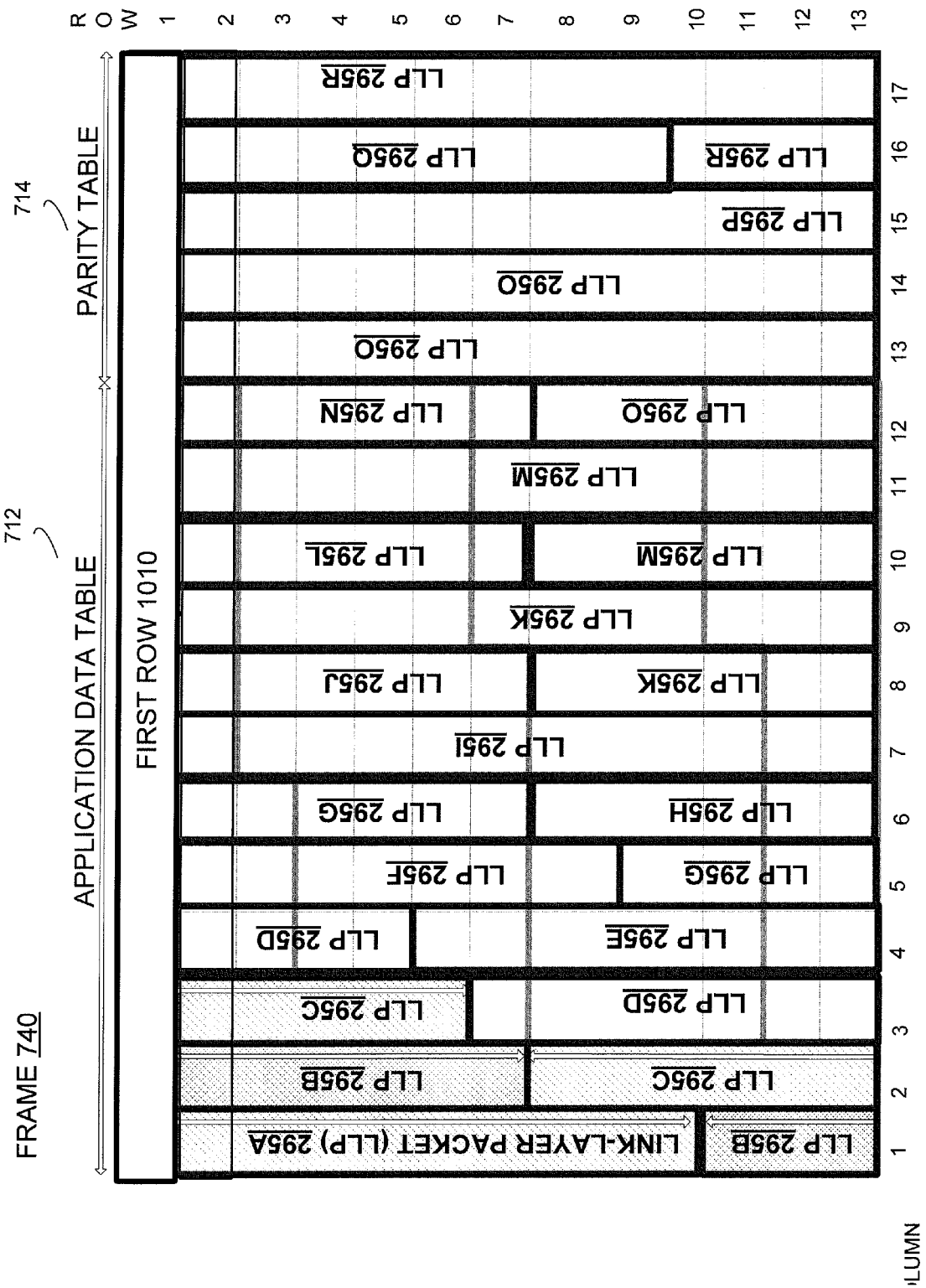

FIG. 10 depicts an example of a row 1010, which will be decoded by outer decoder 725. Although FIG. 10 depicts a single row 1010 selected for decoding, outer decoder 725 typically decodes each of the rows of frame 240.

Figure 11:
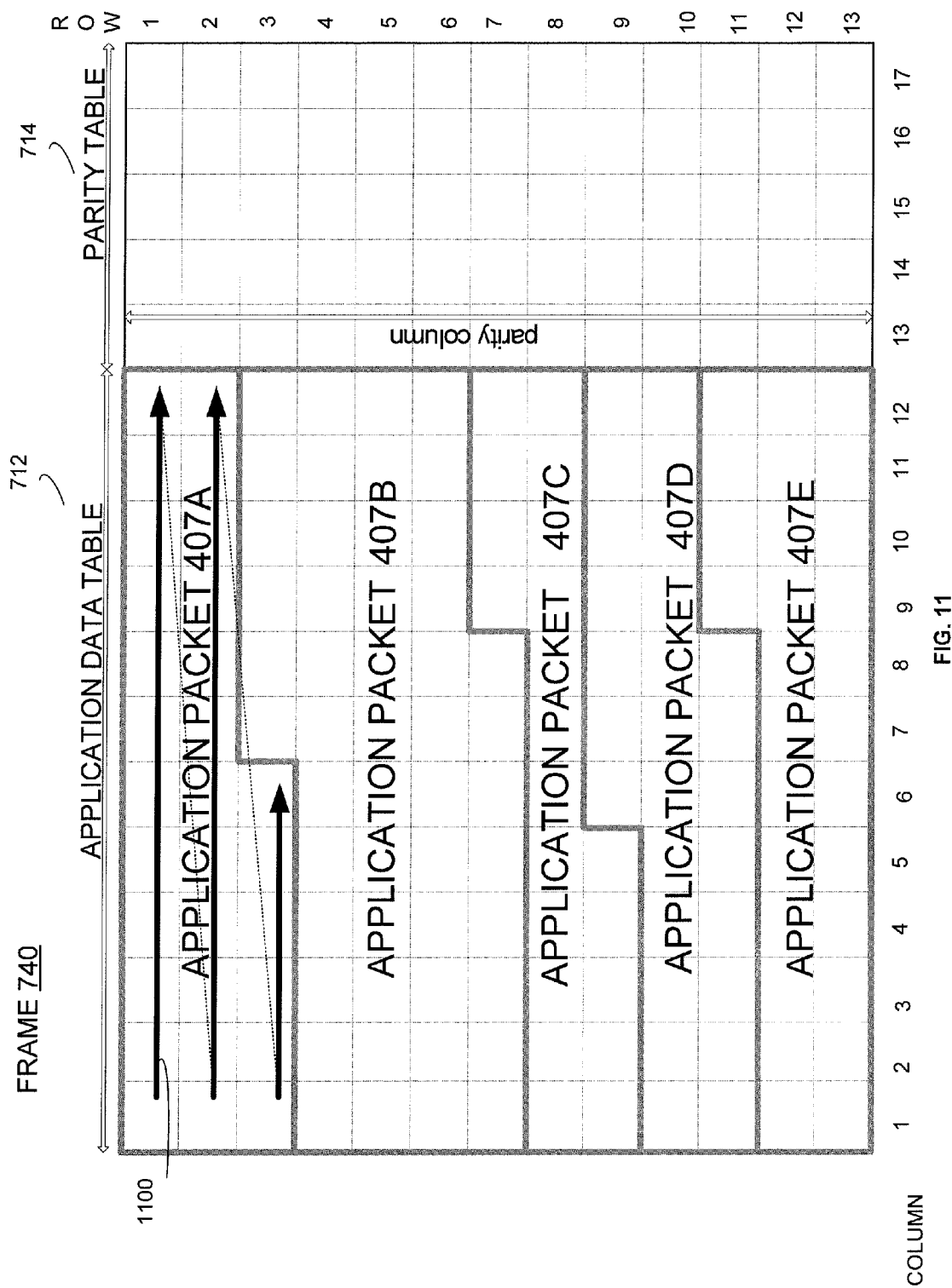

FIG. 11 depicts frame 740 after each row has been decoded by outer decoder 725. The deframer 710 reads frame 740 row-wise. For example, to form the application data packet 407A, deframer 710 reads row-wise the values of the first row, the second row, and a portion of the third row of frame 740. Moreover, although FIG. 11 depicts a row-wise read pattern 1100, other row-wise read patterns may be used as well. Furthermore, frame 740 may include packet delimiter information to indicate the start and stop of each of the application data packets 407A-E. Although FIG. 11 depicts a row-by-row reading of frame 740, deframer 710 would read frame 740 consistent with how the application data packets were written into the frame 240 at the base station. For example, when application data packets are written into frame 240 in a block-by-block manner, as described above with respect to FIG. 4B, deframer 710 reads frame 740 in a block-by-block manner, as well.

At 850, deframer 710 provides the read packet, such as application data packets 407A-E, to another component, such as a higher-layer application at client station 114A. For example, application data packets 407A-E may be associated with an application, such as a digital video broadcast application at client station 114A. When that is the case, the use of outer coding as described above with respect to processes 300 and 800, enables the digital video broadcast to be provided to client station 114A with fewer errors and/or enhanced throughput.

The use of an outer code as described above with respect to processes 300 and 800 may improve the throughput of a channel as well as the quality of the data by correcting and/or detecting errors in the data. Specifically, the way the packets, such as the application data packets, are written row-wise into frame 240, encoded row-wise, and then read from frame 240 column-wise improves error correction and/or detection. The outer coding process, described above with respect to processes 300 and 800, has, in some implementations, one or more features that provide that enhanced performance.

One such feature is that the number of blocks (or FEC blocks) contributing to each outer codeword is maximized. For example, FIG. 6 depicts block 605A, which includes ten outer coder words 510A-J. This provides better averaging and better time diversity, which minimizes the codeword error rate by distributing the transmission of any single outer codeword over time as each block is transmitted—thus minimizing the affects of an error burst on any given codeword. Another feature is that the packet, such as the application data packet, inserted into the frame row-wise corresponds to a small number of codewords. Therefore, for a given codeword error rate, the error rate of the corresponding packets is minimized. For example, application data packet 407A inserted row-wise into the first three rows of frame 240 is encoded by three outer codewords 510A-C as depicted at FIGS. 4 and 5. As such, errors in the codewords affect fewer packets, when compared to an approach that writes packets column-wise and then reads those packets column-wise to encode them. Moreover, another feature is that an outer codeword coincides with a small number of packets. Therefore, each codeword error corresponds to a small number of packet errors, when compared to an approach that writes packets column-wise and then reads those packets column-wise to encode them.

Moreover, the outer coding approach described above with respect to processes 300 and 800 may result in the application packet error rate being significantly reduced while using the same amount of overhead, such as the parity symbols of parity table 214, when compared to an approach that inserts the application data packets column-wise and then reads the packets, after encoding, column-wise. Furthermore, the outer coding approach described above with respect to processes 300 and 800 may be used to reduce the amount of parity used in frame 240 to save bandwidth rather than correct additional errors. In addition, the outer coding approach described above with respect to processes 300 and 800 may avoid bursty packet error patterns while minimizing the packet error rate by distributing the transmission of any single outer codeword over time as each block is transmitted.

Although the description above describes the inner coder 225, framer 210, and outer coder 220 at a base station, the inner coder 225, framer 210, and outer coder 220 may be implemented at other locations, such as at a client station. Furthermore, although the description above describes the inner decoder 720, deframer 710, and outer decoder 725 at a client station, the inner decoder 720, deframer 710, and outer decoder 725 may be implemented at other locations, such as at a base station.

Figure 12:
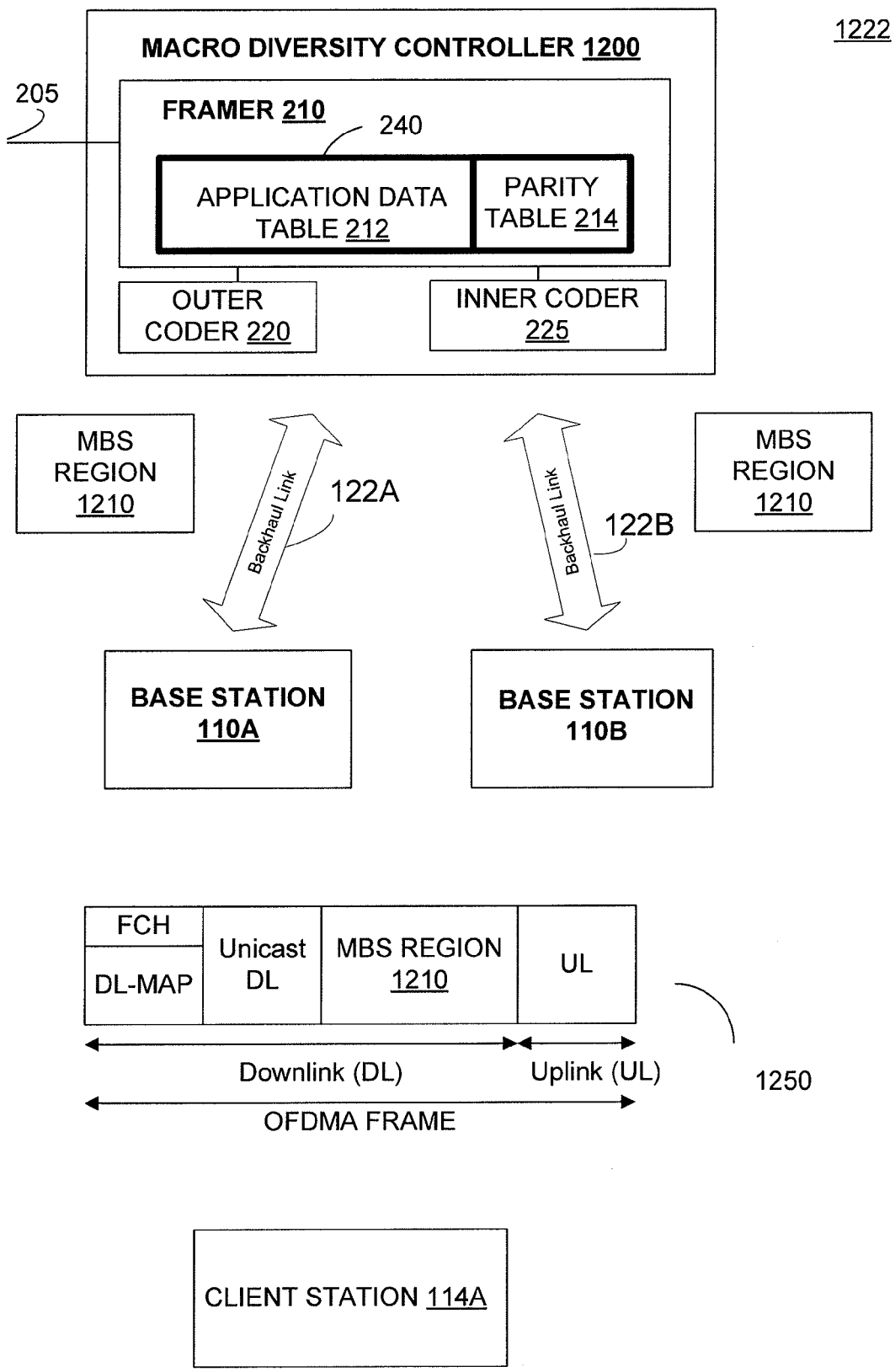
FIG. 12 depicts a block diagram of a controller implementing outer coding.

FIG. 12 depicts an implementation of framer 210, outer coder 220, and inner coder 225 in a macrodiversity controller 1200. The output of the inner coder 225 may be link-layer packets that are used as protocol data units (PDUs), such as HARQ PDUs in conformance with IEEE 802.16. The PDUs are inserted into a macrodiversity region, such as a multicast and broadcast region (MBS) consistent with IEEE 802.16. As used herein, the phrase "macrodiversity region" refers to any type of data region of a data frame usable for broadcast data. The macrodiversity controller 1200 distributes the MBS region 1210 to zero or more base stations 110A and 110B. The macrodiversity controller 1200 also schedules the transmissions of MBS regions 1210 at base stations 110A and 110B, such that the base stations synchronously transmit the MBS regions over the same frequency using the same waveform (e.g., same modulation and coding scheme), and using the same framing parameters (e.g., number of symbols in the OFDMA frame, length of symbol, cyclic prefix, and the like). In the present embodiment, the base stations 110A and 110B each insert the MBS region 1210 into an OFDMA frame 1250. The base stations then transmit the OFDMA frame 1250 to client stations, such as client station 114A. The MBS region 1210 is transmitted using macrodiversity, while other portions of the OFDMA frame 1250 may not use macrodiversity.

At the client station, such as client station 114A, macrodiversity provides a so-called "macrodiversity gain" by combining the synchronous broadcast by base stations 110A and 110B. For example, base station 110A and base station 110B would each transmit frame 1250 including the frame control header (FCH), downlink map (DL-MAP), and unicast downlink (DL) without using macrodiversity. Although the same MBS region is broadcast using macrodiversity from base stations 110A-B, the other data regions, such as the unicast downlink, may be unique to each base station. Base stations 110A and base station 110B each transmit MBS region 1210, at the same frequency and at the same time using the same waveform, framing parameters, and a common waveform—providing at the client station 114A macrodiversity gain with respect to the transmitted MBS region 1210.

Although the example of FIG. 12 refers to two base stations 110A and 11B, there may be additional base stations operating using macrodiversity to transmit MBS regions. Moreover, in the example of FIG. 12, the outer coder 220 would use the same RS code in a particular zone, such as a geographic area, to allow macrodiversity. However, in some implementations, the same system 1222 includes another macrodiversity controller with a different outer code in its outer coder, in which case the system 1222 may provide another zone of macrodiversity using the other outer code. In some implementations, the macrodiversity controller 1200 may receive packets 205 corresponding to streams of multimedia content, such as digital broadcast television and the like, each stream associated with one or more zones. Moreover, although FIG. 12 depicts the macrodiversity controller 1200 as separate from base stations 110A, 110B, and network controller 124, macrodiversity controller 1200 may be incorporated into at least one of a base station, a network controller, and the like.

The subject matter described herein may be embodied in systems, apparatus, methods, and/or articles depending on the desired configuration. In particular, various implementations of the subject matter described, such as the components of base station 110B described with respect to FIG. 2, the components of client station 114A as described with respect to FIG. 7, as well as the macrodiversity controller 1200, may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. For example, the components of base station 110B, client station 114A, macrodiversity controller 1200 and aspects of processes 300 and 800 may be realized in digital electronic circuitry, integrated circuitry, specially designed ASICs (application specific integrated circuits), computer hardware, firmware, software (including computer programs), and/or combinations thereof.

These computer programs (also known as programs, software, software applications, applications, components, or code) include machine instructions for a programmable processor, and may be implemented in a high-level procedural and/or object-oriented programming language, and/or in assembly/machine language. As used herein, the term "machine-readable medium" refers to any computer program product, computer-readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. For example, the implementations described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Moreover, although the above describes writing to a frame row-wise and then reading from that frame column-wise, the rows and columns of the frame can be swapped (e.g., by rotating the frame by 90 degrees), in which case the above noted processes and systems continue to be operative. Other embodiments may be within the scope of the following claims.

What is claimed is:

1. A method comprising:
    inserting a received packet into one or more rows of a frame;
    encoding, using an outer code, the one or more rows including the received packet;
    reading one or more blocks of data from a column of the frame, the frame including the one or more rows encoded using the outer code; and
    providing the one or more blocks of data to enable an inner code to encode the one or more blocks of data before transmission.

2. The method of claim 1, wherein inserting further comprises:
    inserting a portion of the received packet into a first row of the frame and,
    when the first row is filled, inserting a remaining portion of the received packet into a second row of the frame.

3. The method of claim 2 further comprising:
    encoding the first row using the outer code to form a first codeword; and
    encoding the second row using the outer code to form a second codeword.

4. The method of claim 1, wherein encoding, using the outer code, further comprises: using a forward error-correction code to encode each of the rows, each encoded row forming a codeword.

5. The method of claim 1, wherein encoding, using the outer code, further comprises: using a Reed-Solomon (RS) forward error-correction code to encode each of the rows, each encoded row forming an RS codeword.

6. The method of claim 1, wherein providing further comprises: inserting the one or more blocks of data into a link-layer packet, the link-layer packet encoded using the inner code before being sent.

7. The method of claim 1, further comprising: encoding, using the inner code, a link-layer packet.

8. The method of claim 7 further comprising: encoding, using at least one of a Convolution Code (CC) and a Convolutional Turbo Code (CTC), the link-layer packet before sending the encoded link-layer packet through a channel to a client station configured to receive the encoded link-layer packet.

9. The method of claim 1, wherein inserting the received packet further comprises: inserting the received packet into the frame on a block basis.

10. The method of claim 1 further comprising: arranging each of the one or more rows as a horizontal portion of the frame; and arranging the column as a vertical portion of the frame.

11. The method of claim 1 further comprising: arranging each of the one or more rows as a vertical portion of the frame; and arranging the column as a horizontal portion of the frame.

12. A method comprising:
    decoding, using an inner code, one or more link-layer packets;
    inserting one or more of the decoded link-layer packets into one or more columns of a frame;
    decoding, using an outer code, one or more rows of the frame, when the columns of the frame have been filled; and
    reading the one or more rows of the frame, when the one or more rows are decoded using the outer code, the one or more rows of the frame forming an application data packet.

13. The method of claim 12, wherein decoding, using the inner code, the one or more link-layer packets further comprises: decoding, at a client station, the one or more link-layer packets using at least one of a Convolution Code (CC) and a Convolutional Turbo Code (CTC).

14. The method of claim 12, wherein decoding, using the outer code, the at least one row further comprises: reading the one or more rows to enable a Reed-Solomon (RS) forward error-correction decoder to decode the one or more rows, the one or more decoded rows comprising the application data packet.

15. The method of claim 12, wherein inserting further comprises: inserting one or more of the decoded link-layer packets into a first column of the frame, and, when the first column is full, into a second column of the frame.

16. The method of claim 12 further comprising:
    arranging each of the one or more rows as a horizontal portion of the frame; and
    arranging each of the one or more columns as a vertical portion of the frame.

17. The method of claim 12 further comprising:
    arranging each of the one or more columns as a horizontal portion of the table; and
    arranging each of the one or more rows as a vertical portion of the table.

18. A system comprising:
    means for inserting a received packet into one or more rows of a frame;
    means for encoding, using an outer code, the one or more rows including the received packet;
    means for reading one or more blocks of data from a column of the frame, the frame including the one or more rows encoded using the outer code; and
    means for providing the one or more blocks of data to enable an inner code to encode the one or more blocks of data before transmission.

19. A system comprising:
    a framer configured to insert a received packet into one or more rows of a frame;
    an outer coder configured to encode, using an outer code, the one or more rows including the received packet; and
    wherein the framer is configured to read one or more blocks of data from a column of the frame, the frame including the one or more rows encoded using the outer code and to provide the one or more blocks of data to enable an inner code to encode the one or more blocks of data before transmission through a wireless network.

20. The system of claim 19 further comprising: an inner encoder coupled to the framer, the inner encoder configured to encode the one or more blocks of data using an inner code before the one or more blocks of data are transmitted.

21. A system comprising:
a deframer configured to insert one or more link-layer packets into one or more columns of a frame;
an outer decoder configured to decode, using an outer code, one or more rows of the frame, when the columns of the frame have been filled; and
wherein the deframer is configured to read the one or more rows of the frame, when the one or more rows are decoded using the outer code, the one or more rows of the frame forming an application data packet, and
wherein the deframer is further configured to read, from columns of the frame, one or more blocks, when at least one row of the frame has been decoded using the outer code.

22. The system of claim 21 further comprising: an inner decoder coupled to the deframer, the inner decoder using an inner code to decode the one or more link-layer packets, the decoded link-layer packets inserted into the one or more columns of the frame.

23. A non-transitory computer-readable medium containing instructions to configure at least one processor to perform a method, the method comprising:
inserting a received packet into one or more rows of a frame;
encoding, using an outer code, the one or more rows including the received packet;
reading one or more blocks of data from a column of the frame, the frame including the one or more rows encoded using the outer code; and
providing the one or more blocks of data to enable an inner code to encode the one or more blocks of data before transmission.

24. A non-transitory computer-readable medium containing instructions to configure at least one processor to perform a method, the method comprising:
decoding, using an inner code, one or more link-layer packets;
inserting one or more of the decoded link-layer packets into one or more columns of a frame;
decoding, using an outer code, one or more rows of the frame, when the columns of the frame have been filled; and
reading the one or more rows of the frame, when the one or more rows are decoded using the outer code, the one or more rows of the frame forming an application data packet.

* * * * *